United States Patent
Chan et al.

(10) Patent No.: US 8,804,436 B1
(45) Date of Patent: Aug. 12, 2014

(54) METHOD OF PARTIAL REFRESH DURING ERASE OPERATION

(71) Applicant: Winbond Electronics Corp., Taichung (TW)

(72) Inventors: Johnny Chan, Fremont, CA (US); Teng Su, Milpitas, CA (US); Koying Huang, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 13/937,804

(22) Filed: Jul. 9, 2013

(51) Int. Cl.
*G11C 16/04* (2006.01)
*G11C 16/16* (2006.01)

(52) U.S. Cl.
CPC ...................................... *G11C 16/16* (2013.01)
USPC ............. 365/185.29; 365/185.22; 365/185.28

(58) Field of Classification Search
USPC ............. 365/185.29, 185.22, 185.24, 185.19, 365/185.18
See application file for complete search history.

(56) References Cited

U.S. PATENT DOCUMENTS 8,498,163 B2 * 7/2013 Yang .................. 365/185.29

* cited by examiner

*Primary Examiner* — David Lam
(74) *Attorney, Agent, or Firm* — Muncy, Geissler, Olds & Lowe, P.C.

(57) ABSTRACT

A method of erasing a target erase area of a non-volatile memory is provided, wherein the non-volatile memory is divided into an target erase area and an unselected area, and the method includes the steps in an erase cycle of: conditioning the target erase area of the non-volatile memory, wherein the unselected area is an area, excluding the target erase area, in the non-volatile memory; erasing target cells of the target erase area, wherein the threshold of the target cells is not greater than an erase verify voltage; soft-programming the target cells, wherein the threshold of the target cells is not less than a soft program verify voltage, wherein the soft program verify voltage is less than the erase verify voltage; and refreshing a predefined portion of the unselected area, wherein the predefined portion in the erase cycle is less than the unselected area.

18 Claims, 8 Drawing Sheets

METHOD OF PARTIAL REFRESH DURING ERASE OPERATION

BACKGROUND OF THE INVENTION

1. Field of the Invention

The disclosure relates generally to refreshing non-volatile memory devices, more particularly, relates to a method of partially refreshing non-volatile memory devices to decrease the time needed for erasing thereof.

2. Description of the Related Art

A flash memory device is a specific type of non-volatile memory by which bits of logical data are stored in memory cells. A grouping of memory cells is a word, a grouping of words is a page, and a grouping of pages is a sector. Data is accessed for reading and programming by words or pages, and an entire sector must be accessed for erasing. In general, the flash memory is arranged into columns and rows of memory cells, wherein each column represents a bit line of a data.

Voltages can be applied to the transistor for setting the $V_T$ (programmable threshold voltage), to represent a logical value "1" or "0," for reading the data stored in the memory cell, for verifying that the cell has been programmed, for verifying that the cell has been erased, and for verifying that the cell has not been over-erased. When a voltage sufficiently exceeding the $V_T$ is applied to the control gate, the transistor turns on and can conduct a substantial current. Conversely, when a voltage applied to the gate does not sufficiently exceed the $V_T$, the transistor will remain in an off state and will not conduct a substantial current. In typical flash memory designs, the on state represents a logical "1" while the off state represents a logical "0." For example, during a read cycle of a programmed memory cell, the voltage applied to the gate is not greater than $V_T$, and the memory cell will not conduct current. In comparison, an erased memory cell will conduct current during a read cycle because the gate voltage is greater than $V_T$. Thus, a programmed memory cell represents logical "0," while and erased memory cell represents logical "1."

It is well known that flash memory devices have a limited number of erase-program cycles before they can no longer be used to store data reliably. More specifically, flash memory cells are subject to program/erase cycle wearing, which is a progressive degradation of a flash memory cell due to cumulative program and erase operations. Those skilled in the art will understand that a memory block is always erased first prior to being programmed with data, hence the cycles can be referred to as both program and erase cycles. Those skilled in the art will also understand that partial erase within a physical block is practicable as long as unselected portion of the physical block is properly counter-biased. However, the unselected portion may still need to be refreshed to guarantee the cell integrity. When memory cells are degraded, higher program and erase voltages are needed to program or erase the memory cells to the desired threshold voltages. Eventually, the memory cells will fail to retain data properly, which is represented as a programmed threshold voltage.

This problem is compounded by the fact that the block size of flash memory devices continues to increase while the data file sizes stored therein remain relatively static. For example, block sizes for present day high density flash devices are in the range of 256 KB, but future high density flash devices will have block sizes approaching 512 KB. If the data file stored in the block is small, then more memory cells will be unnecessarily subjected to erase/program cycles relative to a block have the size of the data file when the data file is modified.

Accordingly, an effective erase method is desired, which reduces unnecessary erase time and reduces the erase time of each cycle for extending the life span of the flash memory.

BRIEF SUMMARY OF THE INVENTION

For solving the above problems, the invention provides a method to lower the total erase time by partial refresh for further saving the time of the partial block erase process.

An embodiment of a method of erasing a target erase area of a non-volatile memory is provided, wherein the non-volatile memory is divided into a target erase area and an unselected area, and comprises the steps in an erase cycle of: conditioning the target erase area of the non-volatile memory, wherein the unselected area is an area, which is excluding the target erase area, in the non-volatile memory; erasing target cells of the target erase area, wherein the target cells are set to have a threshold voltage which is not greater than an erase verify voltage; soft-programming the target cells, wherein the target cells are set to have the threshold voltage which is not less than a soft program verify voltage, wherein the soft program verify voltage is less than the erase verify voltage; and refreshing a predefined portion of the unselected area, wherein the predefined portion to be refreshed is less than the unselected area.

An embodiment of a method of erasing a target erase area of a non-volatile memory is provided, wherein an area of the predefined portion of the unselected area is a half of the unselected area in an X direction.

An embodiment of a method of erasing a target erase area of a non-volatile memory is provided, wherein an area of the predefined portion of the unselected area is a half of the unselected area in a Y direction.

An embodiment of a method of erasing a target erase area of a non-volatile memory is provided, wherein the unselected area is divided into a plurality of unselected sub-areas and also numbered, respectively, with odd numbers and even numbers, which respectively correspond to an odd area and an even area, and the predefined portion corresponds to one of the odd area and the even area.

An embodiment of a method of erasing a target erase area of a non-volatile memory is provided, wherein a non-volatile counter in the non-volatile memory alternatively outputs one of a first state and a second state, wherein one of the odd area and the even area is refreshed when the non-volatile counter outputs one of the first state and the second state which is stored in the non-volatile counter to record that one of the odd area and the even area has been refreshed until next refreshing.

An embodiment of a method of erasing a target erase area of a non-volatile memory is provided, wherein the non-volatile counter changes to output the other one of the first state and the second state during a next refreshing, and the other of the odd area and the even area is refreshed accordingly.

An embodiment of a method of erasing a target erase area of a non-volatile memory is provided, wherein the unselected area is divided into 4 or 8 unselected sub-areas if the non-volatile counter outputs 4 states or 8 states, respectively.

An embodiment of a method of erasing a target erase area of a non-volatile memory, wherein a volatile counter in the non-volatile memory, with an arbitrary initial state, alternatively outputs one of a first state and a second state, and the first state corresponds to the refreshing of the odd area, and the second state corresponds to the refreshing of the even area.

An embodiment of a method of erasing a target erase area of a non-volatile memory is provided, wherein one of the odd area and the even area is refreshed during power up, and the other one the odd area and even area is refreshed during power down.

An embodiment of a method of erasing a target erase area of a non-volatile memory is provided, wherein one of the odd area and the even area is refreshed when the volatile counter outputs the corresponding first state or second state and then the other one of the first state and second state is stored in the volatile counter until next refreshing.

An embodiment of a method of erasing a target erase area of a non-volatile memory is provided, wherein refreshing one of the odd area and the even area is according to a random signal randomly outputting one of the first state and the second state.

An embodiment of a method of erasing a target erase area of a non-volatile memory is provided, wherein the random signal is generated according to an erase verify retry count which is odd or even, wherein when the threshold of the target cells of the predefined portion are not less than the erase verify voltage after erasing, the erase verify retry count is incremented by 1 and erasing again until the threshold of all the target cells is less than the erase verify voltage.

An embodiment of a method of erasing a target erase area of a non-volatile memory is provided, wherein the random signal is generated according to a soft program verify retry count which is odd or even, wherein when the threshold of some of the target cells are erased to be lower than the soft program verify voltage after erasing, the soft program verify retry count is incremented by 1 and soft-programming again until the threshold of all the target cells is greater than the soft program verify voltage.

An embodiment of a method of erasing a target erase area of a non-volatile memory is provided, wherein the random signal is generated according to times of ON/OFF switches of a pump regulator in the non-volatile memory which is odd or even, wherein the pump regulator pumps from a supply voltage to a predetermined level, in which the ON/OFF switch turns on and off randomly to maintain the predetermined level.

An embodiment of a method of erasing a target erase area of a non-volatile memory is provided, wherein the random signal is generated by a first clock signal with a first frequency sampling a second clock signal with a second frequency, wherein the first frequency is lower than the second frequency.

An embodiment of a method of erasing a target erase area of a non-volatile memory is provided, wherein the random signal fed into 2 in-series toggle flip-flops generates a ¼ randomization, and the unselected area is divided into 4 unselected sub-areas.

An embodiment of a method of erasing a target erase area of a non-volatile memory is provided, wherein the random signal fed into 3 in-series toggle flip-flops generates a ⅛ randomization, and the unselected area is divided into 8 unselected sub-areas.

An embodiment of a method of erasing a target erase area of a non-volatile memory is provided, wherein if an erase verify retry count exceeds a predetermined number, the unselected area is entirely refreshed.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
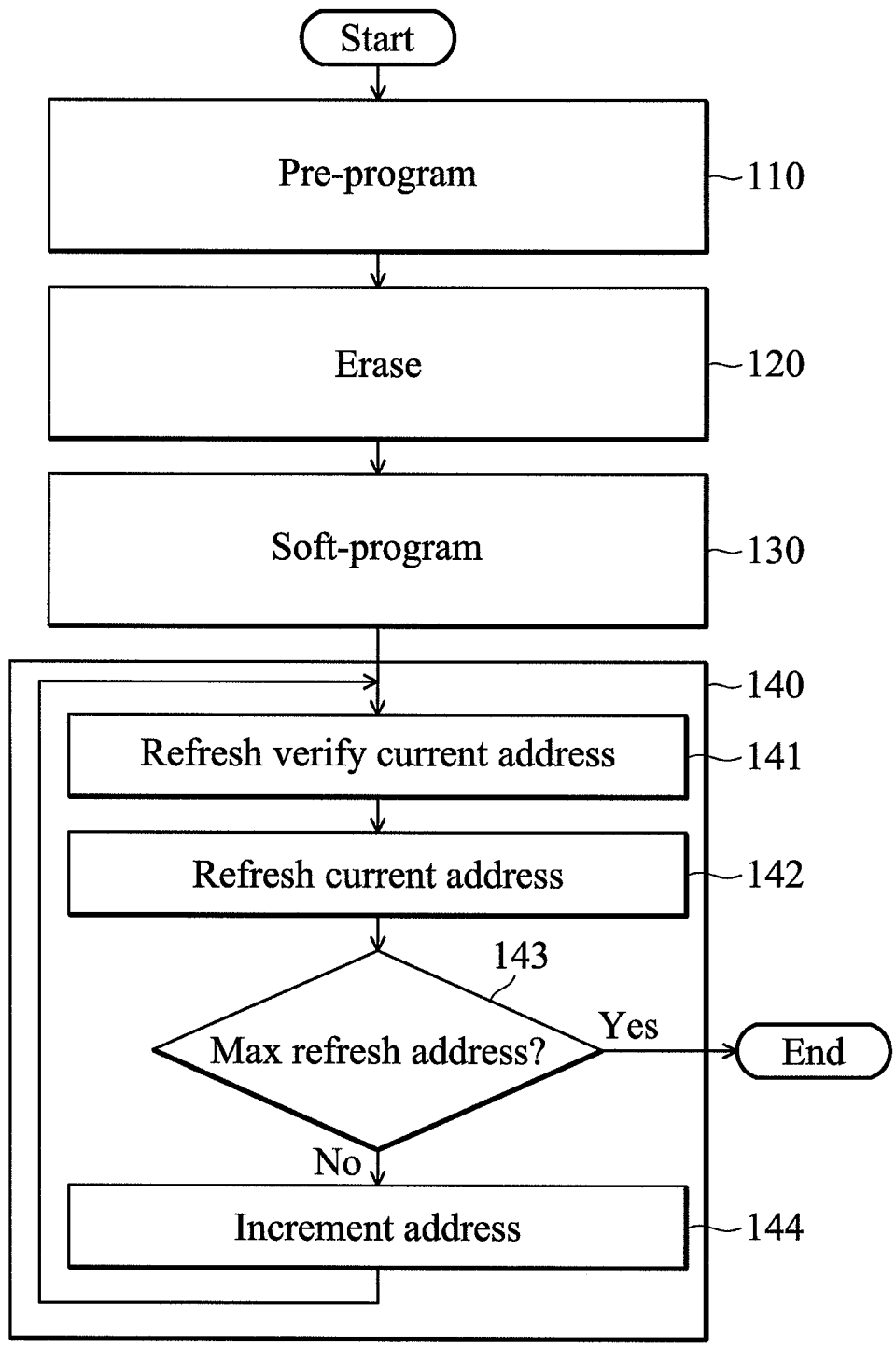
FIG. 1 is a flow chart of an embodiment of a partial block erase process.

FIG. 1 is a flow chart of an embodiment of a partial block erase process. A partial block erase process includes 4 major steps: pre-program (step 110), erase (step 120), soft-program (step 130), and refresh (step 140). When a partial block erase process begins, pre-program (step 110) is first performed on the target erase area of a non-volatile memory, such as a flash memory. According to an embodiment, to facilitate a tight erase $V_T$ distribution, all the memory cells are first programmed before commencing an erase operation. This programming operation, commonly known as "pre-programming," is performed to ensure that all the cells are at a uniformly high $V_T$ before they are then erased. This pre-program operation can be thought of as the pre-conditioning of the array prior to the erase operation. The theory underlying this approach is based on an assumption that if pre-programming is not done before an erase operation, then cells with stored electrons or data will be at a high $V_T$, and cells without stored electrons or data will be at a low $V_T$ at the beginning of the erase operation. This relatively wide $V_T$ distribution at the beginning of an erase operation will translate into a wide erased $V_T$ distribution at the end of the same operation. If instead all the cells are placed at a uniformly high $V_T$ prior to an erase operation, the occurrence of some of the bits having over-erase problems is minimized.

After pre-programming, erase (step 120), soft-program (step 130), and refresh (step 140) are sequentially performed on the target erase area. The respective procedures and purposes of the erase and soft-program were introduced above, so they will not be repeated hereafter. Note that refresh is an important step in a partial erase procedure.

During erase, the target erase area has a negative voltage on the gate and high voltage on the P-well. However, on the unselected area (not to be erased), a counter bias voltage (e.g. 2V) is on the gate and a high voltage is on the P-well, wherein the target erase area and the unselected area are both on the same P-well. On the unselected area, even though a counter bias voltage is on the gate, well disturbance (disturbance through P-well) still exists which may cause slight erasing for the memory cells with high $V_T$ on the unselected area. This kind of disturbance will not cause a programmed cell to become an erased cell right away, but it will slowly move the programmed cell toward the erase level if refresh is not done.

As shown in FIG. 1, during performing refresh, a refresh verify is applied on current address (step 141), and then the refresh verify current is applied to the address of the unselected area that needs to be refreshed (step 142). After the refresh verify current is applied, the address, to which the refresh verify current is applied, needs to be checked if that is the last address that needs to be refreshed (step 143). If yes, the refresh is finished. Otherwise, step 141 is performed, and the refresh procedure is repeated until the last cell of the unselected area is refreshed.

According to an embodiment of the invention, refresh can take up as much as 80% of total erase time. That is, refreshing the entire unselected area takes most of the time during the whole erasing procedure.

Figure 2:
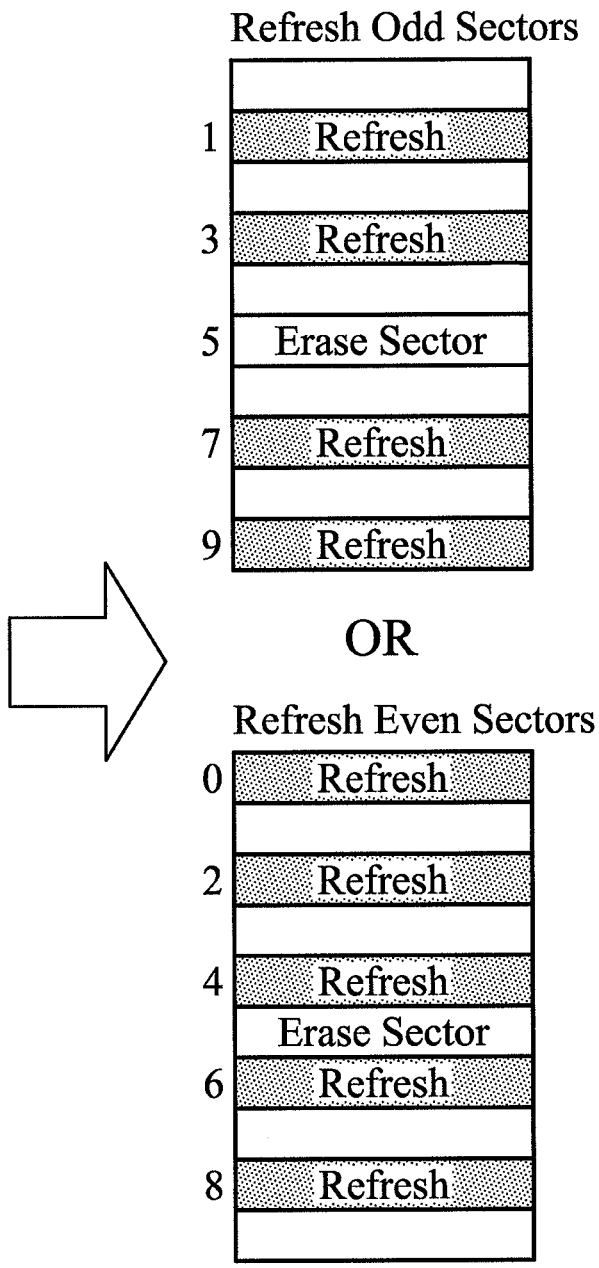
FIG. 2 illustrates the way of division of the unselected area of the memory array in accordance with an embodiment of the invention.

FIG. 2 illustrates the way of division of the unselected area of the memory array in accordance with an embodiment of the invention. As shown in FIG. 2, the unselected area is divided into many sectors in an X direction, and all the sectors are numbered. According to an embodiment of the invention, either even or odd sectors of the unselected area are refreshed during each refresh, and the other half will be refreshed during next refresh.

Figure 3:
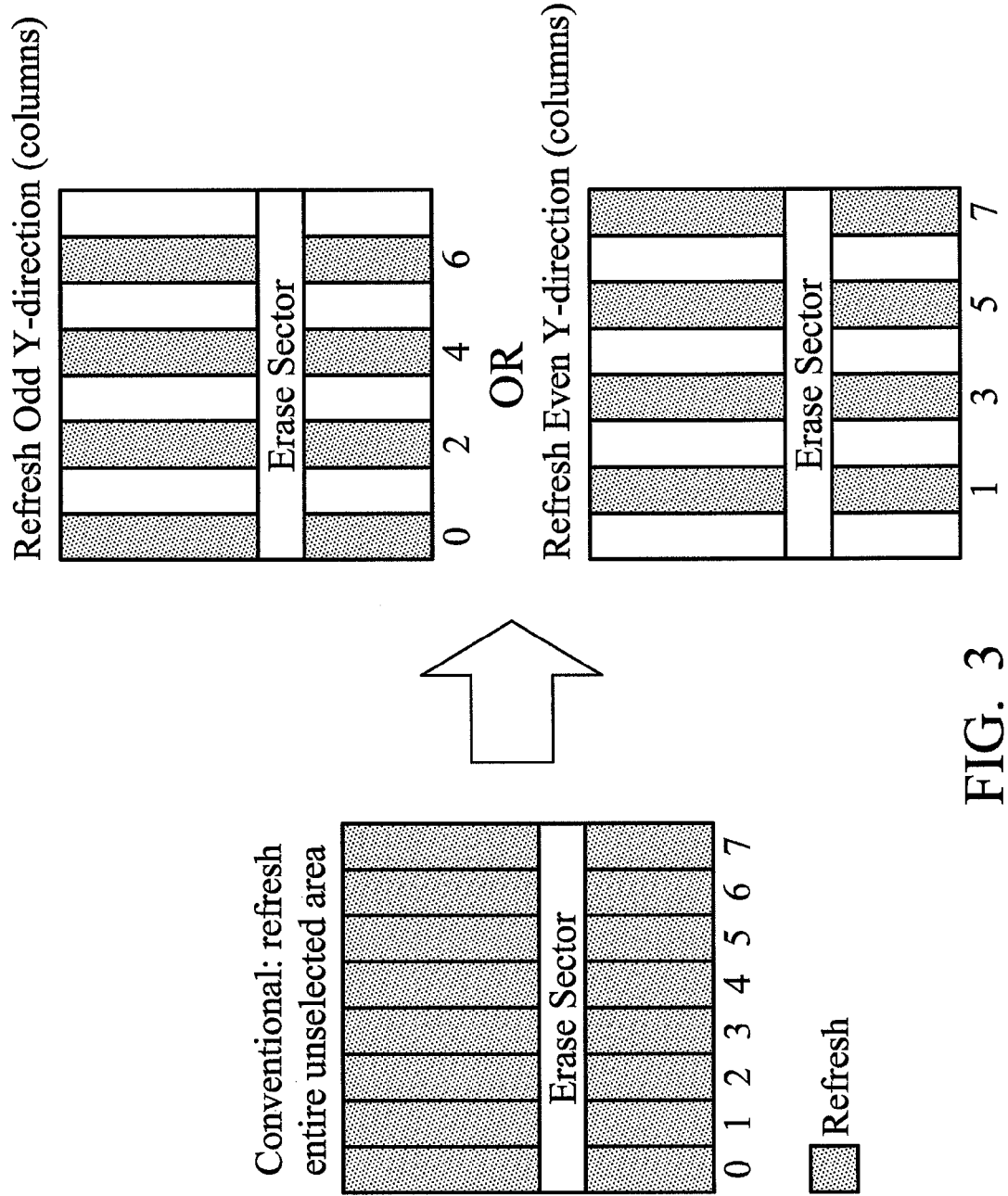
FIG. 3 illustrates another way of division of the unselected area of the memory array in accordance with another embodiment of the invention.

FIG. 3 illustrates another way of division of the unselected area of the memory array in accordance with another embodiment of the invention. As shown in FIG. 3, in contract with FIG. 2, the unselected area is divided into many columns in a Y direction which are numbered as well. According to another embodiment of the invention, either odd columns or even columns are refreshed during each refresh, and the other half will be refreshed during next refresh as well.

According to yet another embodiment of the invention, the unselected area is divided into 4 or 8 portions. During each refresh, only a quarter or an eighth of the unselected area is refreshed, and the others are sequentially refreshed during a next refresh. Partial refresh is acceptable due to disturbance tolerance, which will be described in detail later.

Figure 4:
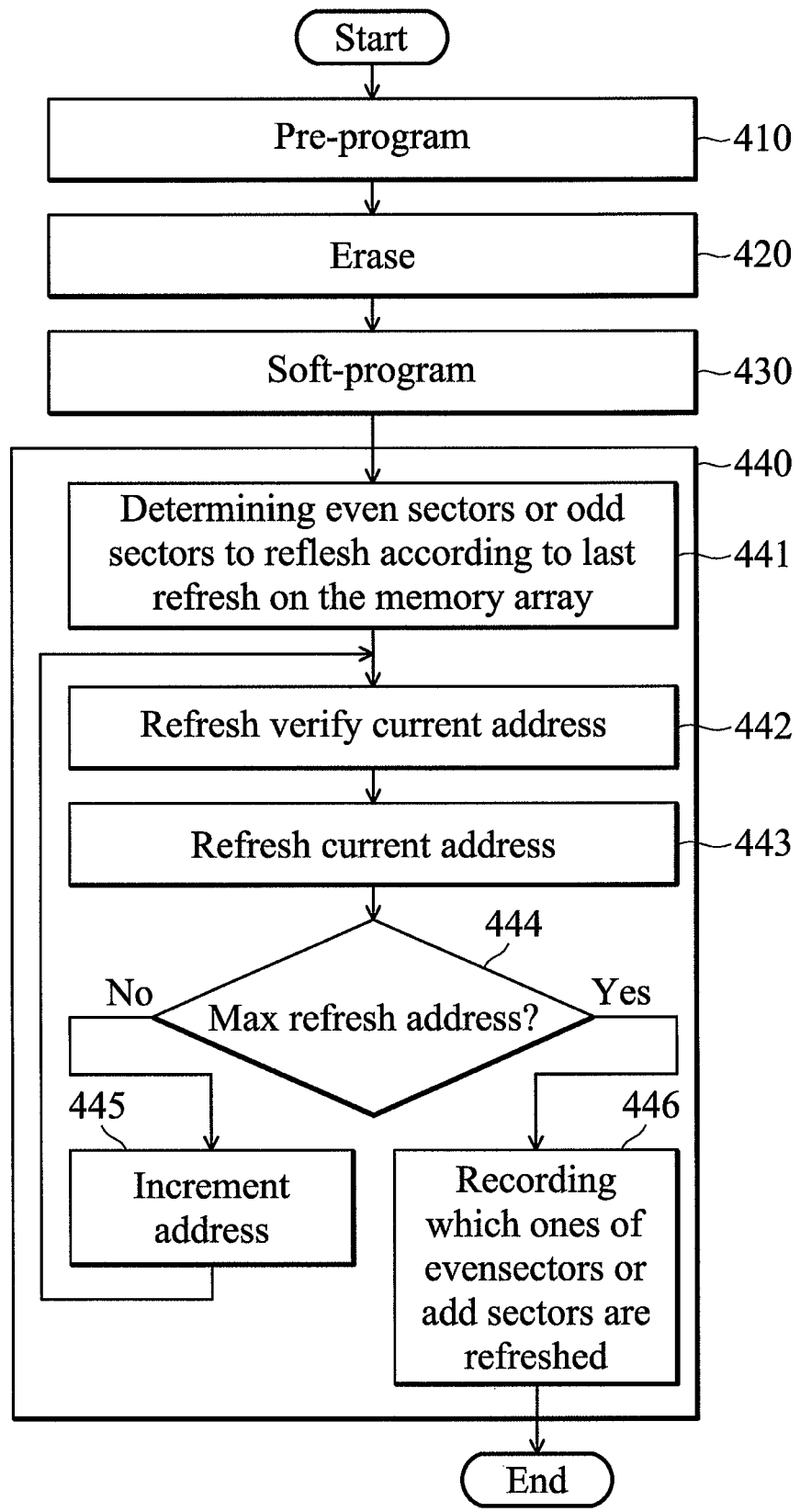
FIG. 4 is a flow chart of an embodiment of a partial block erase process with partial refresh.

FIG. 4 is a flow chart of an embodiment of a partial block erase process with partial refresh. As shown in FIG. 4, steps 410~430 are the same as FIG. 1, and only step 440, refresh, is different. At the beginning of refresh in FIG. 4, either even or odd sectors are determined to be refreshed according to the last refresh on the memory array (step 441). And then, the steps 442~445 are the same as the steps 141~144 in FIG. 1. At the end of refresh, the one of the even or odd sectors which has been refreshed is recorded (step 446). During a next refresh in step 441, the other sectors are determined to be refreshed according to the record in step 446.

According to an embodiment of the invention, a non-volatile counter can be employed to determine where to be refreshed and to record where has been refreshed. The non-volatile counter evenly toggles between the odd and even results, wherein the odd result corresponds to refresh odd sectors, and vice versa. According to an embodiment of the invention, even sectors were refreshed during last refresh, so that the even result is stored in the non-volatile counter. Due to the characteristics of the non-volatile counter, the non-volatile counter will record which sectors of the unselected area was refreshed even after being power down and power up.

According to another embodiment of the invention, a volatile counter can be employed to determine where to refresh and to record where was refreshed. However, the content of the volatile counter will be vanished after power up and power down. Therefore, it is not sure that the content of the volatile counter outputs even or odd after each power up. For example, if the memory array is always powered down after each erase cycle, and then powered up in next erase cycle, and the volatile counter is fixed to one of even and odd during each power up, it may end up with only even or odd sectors of unselected area got refresh in each erase cycle, but the other half remains not to be refreshed. As a result, during power up, a random refresh will be generated as the seed for the volatile counter. After each refresh, an opposite content will be written into the volatile counter. For example, the volatile counter outputs odd content and odd sectors get refreshed. After refresh, even content is written into the volatile counter, which represents even sectors are refreshed in next erase cycle. Therefore, even sectors and odd sectors are refreshed alternatively.

Figure 5:
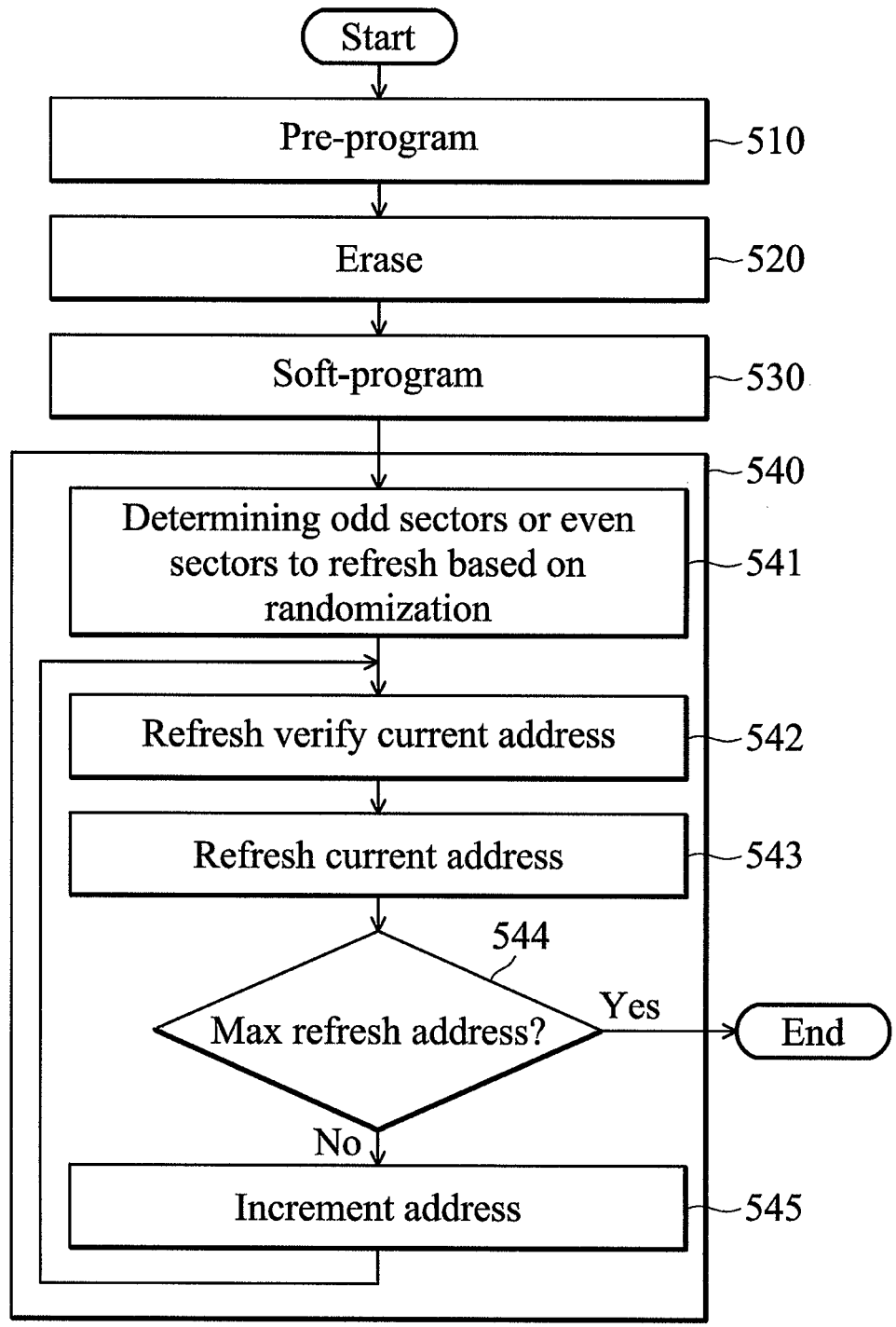
FIG. 5 is a flow chart of another embodiment of a partial erase process with partial refresh.

FIG. 5 is a flow chart of another embodiment of a partial erase process with partial refresh. Comparing FIG. 5 with FIG. 4, steps 510~540 and steps 542~545 of FIG. 5 are almost the same as those in FIG. 4, except for step 541. Before refresh, determination of refreshing even or odd sectors can be based on randomization. Due to the disturbance tolerance, it is not necessary to refresh odd sectors and even sectors with even probability. The disturbance tolerance will be discussed later.

According to an embodiment of the invention, determination of refreshing even or odd sectors can be based on the erase verify retry count. During erase (step 520 in FIG. 5), if the threshold of the cells in the target erase area are not below the erase verify voltage, the erase verify retry count will be incremented by 1. Then, the memory array will issue erase again. Then, the erase verify is executed again to check if the threshold of all cells in the target erase area are below the erase verify voltage. If not, the erase verify retry count will be incremented by 1 again and then erased again. Erase (step 520) will not be done until the threshold of all the cells in the target erase area are below the erase verify voltage. The erase verify retry count is not constant nor predictable for each erase operation, so that it is random.

According to another embodiment of the invention, determination of refreshing even or odd sectors can be based on the soft program verify retry count. After erase, some cells may be erased too much (i.e. $V_T$ is lower than the soft program verify voltage), soft program (step 530 in FIG. 5) needs to be done to bring the low $V_T$ of those cells higher than the soft program verify voltage. Similar to the erase verify retry count, the soft program verify retry count will be incremented by 1 if the threshold of the cells in the target erase area are not greater than soft program verify voltage. However, the soft program verify retry count is also unpredictable and is random.

Figure 6:
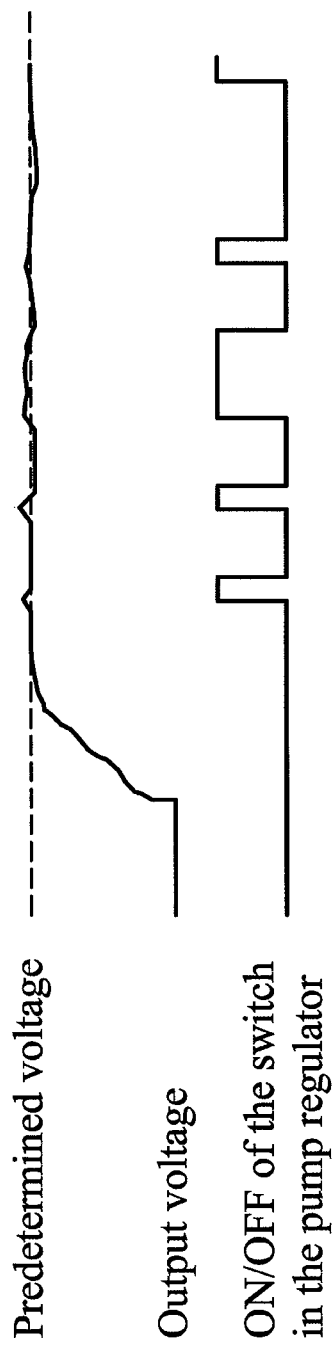
FIG. 6 illustrates the behavior of the pump regulator in accordance with an embodiment of the invention.

According to yet another embodiment of the invention, refreshing even or odd sectors can be determined by the times of ON/OFF switches of a pump regulator. According to an embodiment of the invention, a pump regulator is in the memory array for pumping up the supply voltage to a predetermined voltage. FIG. 6 illustrates the behavior of the pump regulator in accordance with an embodiment of the invention.

As shown in FIG. 6, if the output voltage of the pump regulator is higher than the predetermined voltage, the switch in the pump regulator will be switched off to lower the output voltage. Due to the loading on the pump regulator and discharging from the output voltage, the output voltage may drop below the predetermined voltage, and then the switch in the pump regulator will be switched on again to bring the output voltage back. Accordingly, the times of ON/OFF switches of the pump regulator are random and not predictable, and refreshing even or odd sectors can be determined by the times of ON/OFF switches are even or odd, respectively. According to another embodiment of the invention, refreshing even or odd sectors can be determined by the switch being ON or OFF which is unpredictable as well.

Figure 7:
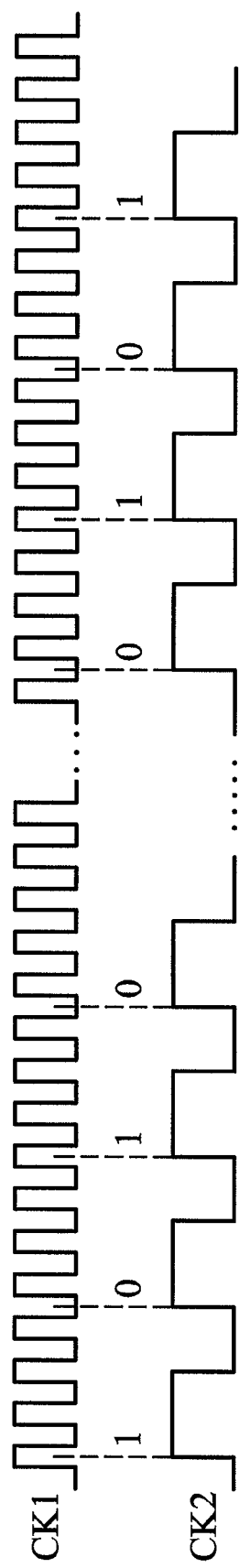
FIG. 7 illustrates how to generate randomization by 2 signals with different frequencies in accordance with an embodiment of the invention.

According to yet another embodiment of the invention, randomization can be generated by 2 clock signals with different frequencies. FIG. 7 illustrates how to generate randomization by 2 signals with different frequencies in accordance with an embodiment of the invention. According to an embodiment of the invention, the clock signals CK1 and CK2 are 2 clock signals in the memory array. For example, the period of the clock signal CK1 is less than 25 ns, and that of the clock signal CK2 is 50 ns. Both the clock signals CK1 and CK2 are fed into a toggle flip-flop, where the clock signal CK2 is used to sample the clock signal CK1 as illustrated in FIG. 7. Because the clock signals CK1 and CK2 are asynchronous, each data that the clock signal CK2 is sampled is unpredictable and random. According to another embodiment of the invention, 2 or 3 toggle flip-flops can be employed for ¼ or ⅛ randomization.

Figure 8:
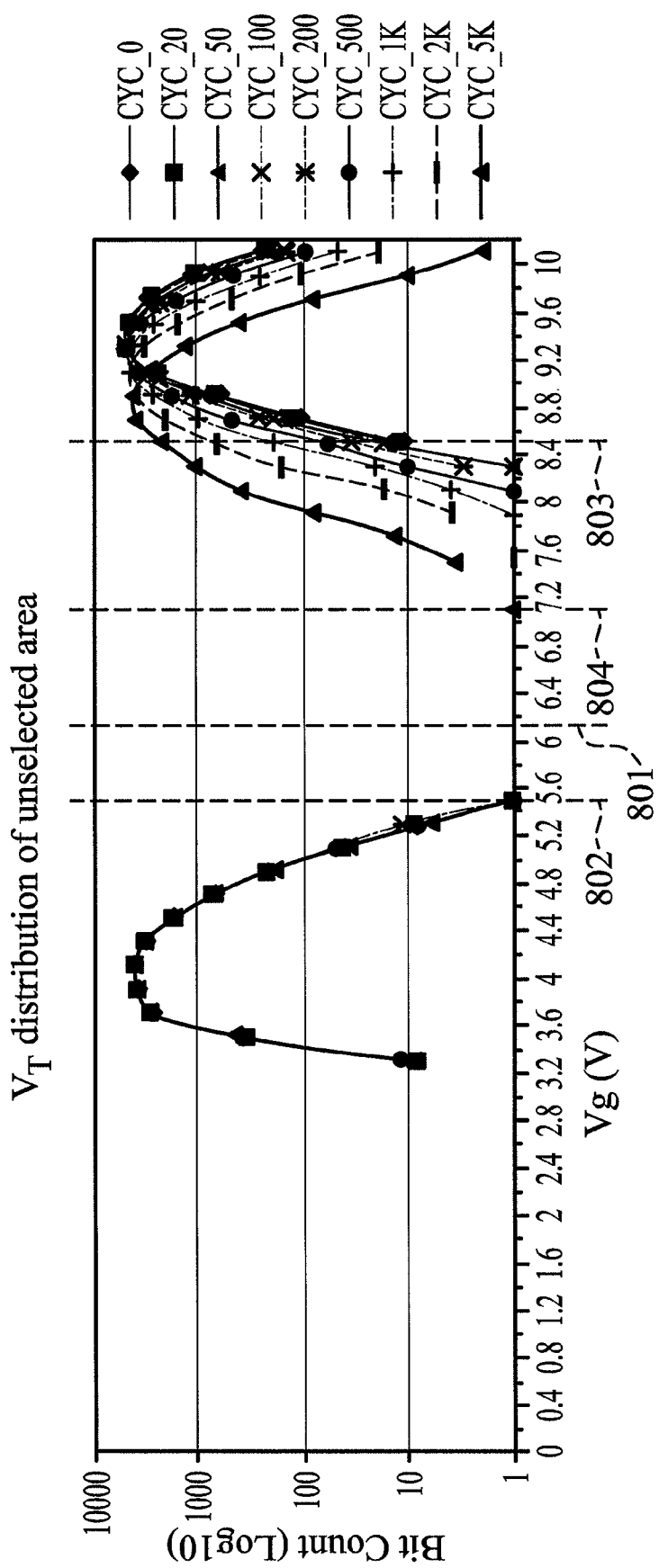
FIG. 8 is a threshold distribution of the unselected area after 5000 erase cycles without refresh of the invention.

FIG. 8 is a threshold distribution of the unselected area after 5000 erase cycles without refresh of the invention. As illustrated in FIG. 8, line 801 is the read voltage level which distinguishes a high threshold level and low threshold level. Line 802 is the erase target which means that the threshold must not be greater than line 802 after erase (step 120 in FIG. 1) or the erase verify retry count will be incremented by 1. Line 803 represents the lowest threshold of the unselected area after the 1$^{st}$ time erase cycle (through step 110 to step 140 in FIG. 1), and line 804 represents the lowest threshold of the unselected area after the 5000$^{th}$ time erase cycle (through step 110 to step 140 in FIG. 1). It is noted that $V_T$ of high $V_T$ cells in the unselected portion will be dropped by around 1.3V after 5000 erase cycles. However, after 5000 erase cycles without refresh, a gap of between the lowest threshold (line 804) and the read voltage level (line 801) is still about 1V. Thus, skipping refresh 5000 times will still okay for read.

According to an embodiment of the invention, well disturbance may be easier and less tolerable after cycling, because memory cell reliability is lower. The bottom line for partial refresh is to lower the entire erase time. After cycling, memory cells may be worn out. The disturbance tolerance will be smaller than that with refresh. If random partial refresh is applied and the randomization is not almost even between odd and even sectors for an extended period of time, the worn-out cell at the high $V_T$ unselected area may drop below the refresh level which means it will never be refreshed again. Therefore, based on the erase verify retry count, if it is higher than a predetermined value, the memory array will return back to full refresh. Because the erase verify retry count or the soft program retry count tend to be higher for the physical block with worn out cell, it can be used as worn out indicator.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A method of erasing a target erase area of a non-volatile memory, wherein the non-volatile memory is divided into the target erase area and an unselected area, the method comprising of the steps in an erase cycle of:

conditioning the target erase area of the non-volatile memory, wherein the unselected area is an area, which is excluding the target erase area, in the non-volatile memory;

erasing target cells of the target erase area, wherein the target cells are set to have a threshold voltage which is not greater than an erase verify voltage;

soft-programming the target cells, wherein the target cells are set to have a threshold voltage which is not less than a soft program verify voltage, and the soft program verify voltage is less than the erase verify voltage; and refreshing a predefined portion of the unselected area, wherein the predefined portion to be refreshed in the erase cycle is less than the unselected area.

2. The method of claim 1, wherein an area of the predefined portion of the unselected area is a half of the unselected area in an X direction.

3. The method of claim 1, wherein an area of the predefined portion of the unselected area is a half of the unselected area in a Y direction.

4. The method of claim 1, wherein the unselected area is divided into a plurality of unselected sub-areas and also numbered, respectively, with odd numbers and even numbers, which respectively correspond to an odd area and an even area, and the predefined portion corresponds to one of the odd area and the even area.

5. The method of claim 4, wherein a non-volatile counter in the non-volatile memory alternatively outputs one of a first state and a second state, wherein one of the odd area and the even area is refreshed when the non-volatile counter outputs one of the first state and the second state which is stored in the non-volatile counter to record that one of the odd area and the even area has been refreshed until next refreshing.

6. The method of claim 5, wherein the non-volatile counter changes to output the other one of the first state and the second state during next refreshing, and the other of the odd area and the even area is refreshed accordingly.

7. The method of claim 6, wherein the unselected area is divided into 4 or 8 unselected sub-areas if the non-volatile counter outputs 4 states or 8 states, respectively.

8. The method of claim 4, wherein a volatile counter in the non-volatile memory, with an arbitrary initial state, alternatively outputting one of a first state and a second state, and the first state corresponds to refreshing the odd area, and the second state corresponds to refreshing the even area.

9. The method of claim 8, wherein one of the odd area and the even area is refreshed during power up, and the other one of the odd area and even area is refreshed during power down.

10. The method of claim 9, wherein one of the odd area and the even area is refreshed when the volatile counter outputs the corresponding first state or second state, and then the other one of the first state and second state is stored in the volatile counter until next refreshing.

11. The method of claim 4, wherein refreshing one of the odd area and the even area is according to a random signal randomly outputting one of the first state and the second state.

12. The method of claim 11, wherein the random signal is generated according to an erase verify retry count which is odd or even, wherein when the threshold of the target cells of the predefined portion are not less than the erase verify voltage after erasing, the erase verify retry count is incremented by 1 and erasing again until the threshold of all the target cells is less than the erase verify voltage.

13. The method of claim 11, wherein the random signal is generated according to a soft program verify retry count which is odd or even, and when the threshold of some of the target cells are erased to be lower than the soft program verify voltage after erasing, the soft program verify retry count is incremented by 1 and soft-programming again until the threshold of all the target cells is greater than the soft program verify voltage.

14. The method of claim 11, wherein the random signal is generated according to times of ON/OFF switches of a pump regulator in the non-volatile memory which is odd or even, and the pump regulator pumps from a supply voltage to a predetermined level, in which the ON/OFF switch turns on and off randomly to maintain the predetermined level.

15. The method of claim 11, wherein the random signal is generated by a first clock signal with a first frequency sampling a second clock signal with a second frequency, wherein the first frequency is lower than the second frequency.

16. The method of claim 11, wherein the random signal fed into 2 in-series toggle flip-flops generates a ¼ randomization, wherein the unselected area is divided into 4 unselected sub-areas.

17. The method of claim 11, wherein the random signal fed into 3 in-series toggle flip-flops generates a ⅛ randomization, wherein the unselected area is divided into 8 unselected sub-areas.

18. The method of claim 1, wherein if an erase verify retry count exceeds a predetermined number, the unselected area is entirely refreshed.

* * * * *